(12) United States Patent
Chen et al.

(10) Patent No.: US 7,791,494 B2
(45) Date of Patent: Sep. 7, 2010

(54) VOLTAGE MONITORING DEVICE

(75) Inventors: Ying Chen, Shenzhen (CN); Jin-Liang Xiong, Shenzhen (CN); Ke-You Hu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 442 days.

(21) Appl. No.: 11/838,902

(22) Filed: Aug. 15, 2007

(65) Prior Publication Data

US 2008/0180265 A1 Jul. 31, 2008

(30) Foreign Application Priority Data

Jan. 26, 2007 (CN) .................. 2007 1 0200122

(51) Int. Cl.
*G08B 21/00* (2006.01)
*H02H 7/00* (2006.01)
*H02H 3/00* (2006.01)

(52) U.S. Cl. ......................... 340/661; 361/6

(58) Field of Classification Search .................. 340/661
See application file for complete search history.

(56) References Cited

U.S. PATENT DOCUMENTS

| | | | | |
|---|---|---|---|---|
| 4,535,282 A | * | 8/1985 | Nguyen | 323/269 |
| 4,613,770 A | * | 9/1986 | Raab | 327/74 |
| 4,977,530 A | * | 12/1990 | Cline et al. | 702/117 |
| 5,652,569 A | * | 7/1997 | Gerstenberger et al. | 340/573.4 |

* cited by examiner

*Primary Examiner*—Benjamin C Lee
*Assistant Examiner*—Cal Eustaquio
(74) *Attorney, Agent, or Firm*—Frank R. Niranjan

(57) ABSTRACT

A voltage monitoring device includes a comparison voltage generating circuit for providing a comparison voltage, a comparator, an electronic switch, and an LED. The comparator outputs a control signal in response to a comparing result between the comparison voltage and a voltage output by a power supply. The electronic switch includes a first terminal receiving the output of the comparator, a second terminal connected to a reference voltage, and a third terminal connected to ground. The LED includes an anode connected to the reference voltage, and a cathode connected to the second terminal of the first electronic switch.

6 Claims, 1 Drawing Sheet

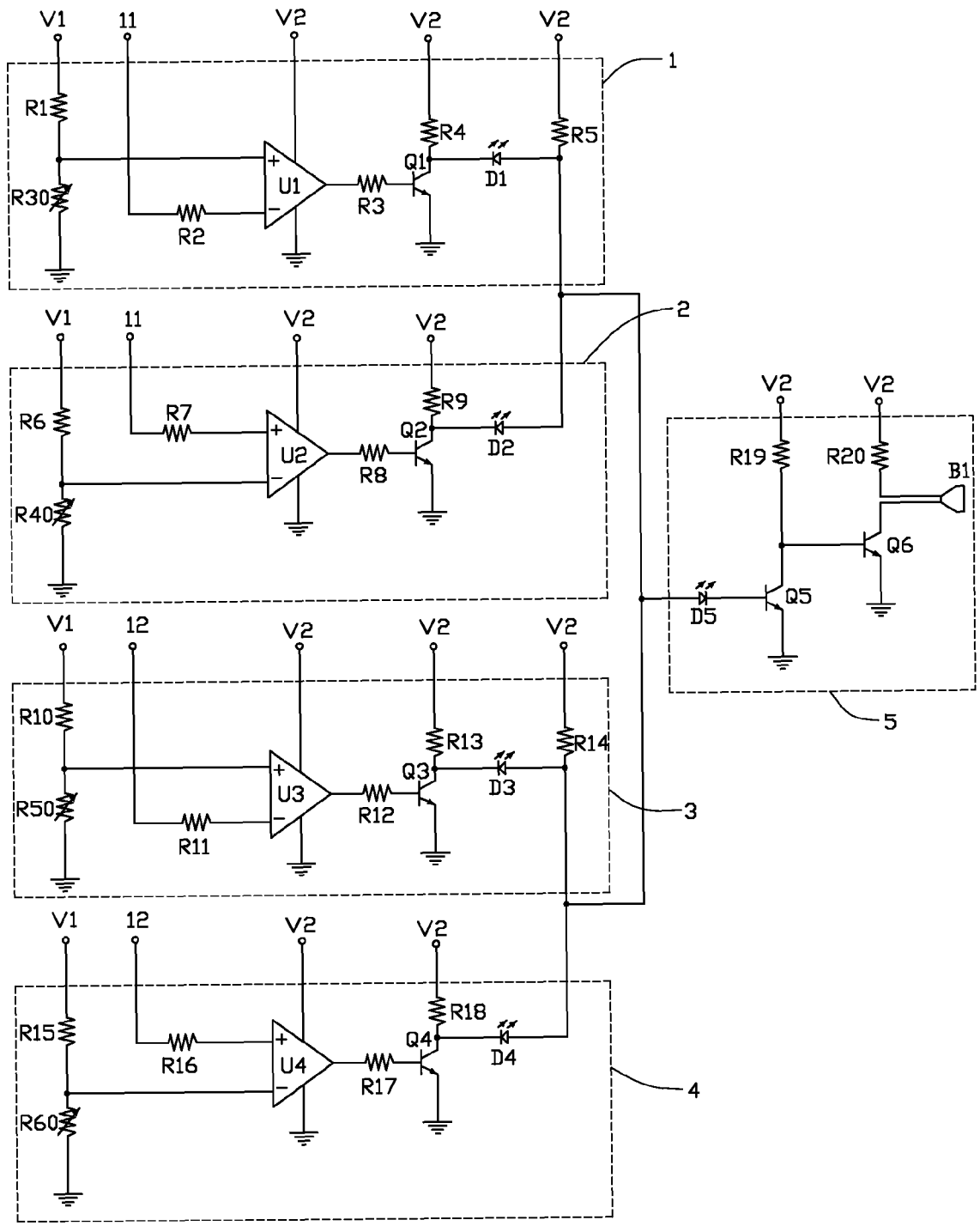

VOLTAGE MONITORING DEVICE

CROSS REFERENCE

This application is related to a copending application entitled with "MONITORING DEVICE FOR MOTHERBOARD VOLTAGE", filed on the same date, and assigned to the same assignee.

BACKGROUND

1. Field of the Invention

The present invention relates to monitoring devices, and particularly to a device for monitoring voltages output by power supplies.

2. Description of Related Art

Usually, computers are equipped with power supplies to provides voltages, e.g. 3.3V, 5V, 12V, −5V, −12V for components on motherboards therein. The components can work normally so long as the voltages received by the components are within specified voltage ranges as determined by the design of the components. If, however, voltage supplied to a component should fall outside the specified voltage range, inoperability or damage may occur.

What is needed, therefore, is a voltage monitoring device, which can determine whether a voltage output by a power supply is within a specified voltage range.

SUMMARY

A voltage monitoring device, which can determine whether a voltage output by a power supply is within a specified voltage range is provided. In an embodiment, the voltage monitoring device includes: a comparison voltage generating circuit for providing a comparison voltage, which equals a lower limit of a specified voltage range; a comparator including a non-inverting input for receiving the comparison voltage, an inverting input for receiving a voltage output by a power supply, and an output for outputting a control signal when the voltage is less than the comparison voltage; an electronic switch including a first terminal connected to the output of the comparator, a second terminal connected to a reference voltage, and a third terminal connected to ground; and a light emitting diode (LED) including an anode connected to the reference voltage, and a cathode connected to the second terminal of the first electronic switch. When the electronic switch receives the control signal, the electronic switch turns on to allow current to pass through the LED such that the LED lights to indicate the voltage is below the lower limit of the specified voltage range.

In the embodiment, the voltage monitoring device also includes: a comparison voltage generating circuit for providing a comparison voltage, which equals an upper limit of the specified voltage range; a comparator including an inverting input for receiving the comparison voltage, a non-inverting input for receiving a voltage output by a power supply, and an output for outputting a control signal when the voltage is greater than the comparison voltage; an electronic switch including a first terminal connected to the output of the comparator, a second terminal connected to a reference voltage, and a third terminal connected to ground; and a light emitting diode (LED) including an anode connected to the reference voltage, and a cathode connected to the second terminal of the first electronic switch. When the electronic switch receives the control signal, the electronic switch turns on to allow current to pass through the LED such that the LED lights to indicate the voltage is greater than the upper limit of the specified voltage range.

Other advantages and novel features will become more apparent from the following detailed description when taken in conjunction with the accompanying drawings, in which:

BRIEF DESCRIPTION OF THE DRAWINGS

The drawing is a schematic diagram of a voltage monitoring device in accordance with an embodiment of the present invention.

DETAILED DESCRIPTION

Referring to the drawing, a voltage monitoring device in accordance with an embodiment of the present invention includes indicating modules 1, 2, 3, 4, and an alarm module 5. The indicating modules 1, 2 determine whether a voltage 11 output by a power supply (not shown) is within a first specified voltage range as determined by the design of a component (not shown). The indicating modules 3, 4 determine whether a voltage 12 output by the power supply is within a second specified voltage range as determined by the design of the component. The alarm module 5 alarms when at least one of the voltages 11, 12 is not within corresponding specified voltage range.

The indicating module 1 includes a first comparison voltage generating circuit including a resistor R1 and a variable resistor R30, resistors R2, R3, R4, R5, comparator U1, bipolar junction transistor (BJT) Q1, and a red light emitting diode (LED) D1. The resistor R1 and the variable resistor R30 are connected between a constant voltage V1 and ground. The variable resistor R30 is adjusted such that a node between the resistor R1 and the variable resistor R30 outputs a first comparison voltage equal to a lower limit of the specified voltage range. The comparator U1 includes a non-inverting input for receiving the first comparison voltage, an inverting input connected to the voltage 11 via the resistor R2, and an output. The BJT Q1 includes a first terminal connected to the output of the comparator U1, a second terminal connected to a reference voltage V2 via the resistor R4, and a third terminal connected to ground. The LED D1 includes an anode connected to the reference voltage V2 via the resistor R5, and a cathode connected to the second terminal of the BJT Q1.

When the voltage 11 is less than the first comparison voltage, the output of the comparator U1 outputs a high-level control signal. The BJT Q1 receives the control signal and turns on. The cathode of the LED D1 is thus connected to ground via the BJT Q1. Current passes through the LED D1 and the LED D1 emits red lights to indicate the voltage 11 is below the lower limit of the first specified voltage range. When the voltage 11 is greater than the first comparison voltage, the output of the comparator U1 outputs a low-level signal. The BJT Q1 receives the low-level signal and turns off. Thus, current does not pass through the LED D1 and the LED D1 does not light.

The indicating module 2 includes a second comparison voltage generating circuit including a resistor R6 and a variable resistor R40, resistors R7, R8, R9, comparator U2, bipolar junction transistor (BJT) Q2, and a red light emitting diode (LED) D2. The resistor R6 and the variable resistor R40 are connected between the constant voltage V1 and ground. The variable resistor R40 is adjusted such that a node between the resistor R6 and the variable resistor R40 outputs a second comparison voltage, which equals to an upper limit of the first specified voltage range. The comparator U2 includes an inverting input for receiving the second comparison voltage, a non-inverting input connected to the voltage 11 via the resistor R7, and an output. The BJT Q2 includes a first terminal connected to the output of the comparator U2, a second terminal connected to the reference voltage V2 via the resistor R9, and a third terminal connected to ground. The LED D2 includes an anode connected to the reference voltage V2 via the resistor R5, and a cathode connected to the second terminal of the BJT Q2.

When the voltage 11 is greater than the second comparison voltage, the output of the comparator U2 outputs a high-level control signal. The BJT Q2 receives the control signal and turns on. The cathode of the LED D2 is thus connected to ground. Current passes through the LED D2 and the LED D2 emits red lights to indicate the voltage 11 is greater than the upper limit of the first specified voltage range. When the voltage 11 is less than the second comparison voltage, the output of the comparator U2 outputs a low-level signal. The BJT Q2 receives the low-level signal and turns off. Thus, current does not pass through the LED D2 and the LED D2 does not light.

The indicating modules 1, 2 cooperatively determine whether the voltage 11 is within the first specified voltage range. If both of the LED D1 and the LED D2 do not light, it indicates the voltage 11 is within the first specified voltage range. If the LED D1 or the LED D2 emits red lights, it indicates the voltage 11 is below the lower limit of the first specified voltage range or greater than the upper limit of the first specified voltage range.

The indicating module 3 includes resistors R10, R11, R12, R13, R14, a variable resistor R50, a comparator U3, a BJT Q3, and a red LED D3. The indicating module 4 includes resistors R15, R16, R17, R18, a variable resistor R60, a comparator U4, a BJT Q4, and a red LED D4. The indicating module 3 has a similar internal structure as the indicating module 1. The indicating module 4 has a similar internal structure as the indicating module 2. The indicating modules 3, 4 cooperatively determine whether the voltage 12 is within the second specified voltage range.

The alarm module 5 includes a green LED D5, a buzzer B1, two BJTs Q5, Q6, and two resistors R19, R20. The LED D5 includes an anode connected to the anode of the LED D1, and a cathode connected a first terminal of the BJT Q5. A second terminal of the BJT Q5 is connected to the reference voltage V2 via the resistor R19, and also connected to a first terminal of the BJT Q6. The buzzer B1 includes a first terminal connected to the reference voltage V2, and a second terminal connected to a second terminal of the BJT Q6. Third terminals of the BJTs Q5, Q6 are connected to ground.

When the voltages 11, 12 are not within their specified voltage ranges, at least one of the BJTs Q1, Q2, Q3, Q4 turns on. The anodes of the LEDs D1, D2, D3, D4, D5 have the same voltage equal to the threshold voltage of the LED D5. Thus, current does not pass through the LED D5 and the LED D5 does not light. A voltage of the cathode of the LED D5 is 0. The BJT Q5 turns off. The BJT Q6 turns on. Current passes through the buzzer B1 and the buzzer B1 alarms. When the voltages 11, 12 are within their specified voltage ranges, BJTs Q1, Q2, Q3, Q4 turns off. A voltage of the anode of the LED D5 is thus greater than the threshold voltage of the LED D5. Therefore, current passes through the LED D5 and the LED D5 emits green lights. The BJT Q5 turns on. The BJT Q6 turns off. Current does not pass through the buzzer B1 and the buzzer B1 does not alarm.

As shown in the foregoing description, when the voltages 11, 12 are within their specified voltage ranges, the LEDs D1, D2, D3, D4 do not light, the LED D5 emits green lights, and the buzzer B1 does not alarm. When one or both of the voltages 11, 12 are not within their specified voltage ranges, corresponding LEDs D1, D2, D3, D4 emits red lights, the LED D5 does not light, and the buzzer B1 alarms.

Because the anodes of the LEDs D1, D2, D3, D4, D5 are connected together, a working state of one of the LEDs D1, D2, D3, D4, D5 does not effect working states of the remaining LEDs D1, D2, D3, D4, D5. Furthermore, the BJTs Q1, Q2, Q3, Q4, Q5, Q6 can be other electronic switches, e.g. MOSFETs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A voltage monitoring device comprising:
a first comparison voltage generating circuit for providing a first comparison voltage which equals an upper limit of a specified voltage range as determined by the design of a component;
a first comparator comprising an inverting input for receiving the first comparison voltage, a non-inverting input for receiving a voltage output by a power supply, and an output for outputting a first control signal when the voltage is greater than the first comparison voltage;
a first electronic switch comprising a first terminal connected to the output of the first comparator, a second terminal connected to a reference voltage, and a third terminal connected to ground;
a first light emitting diode (LED) comprising an anode connected to the reference voltage, and a cathode connected to the second terminal of the first electronic switch, wherein the first electronic switch turns on, when receiving the first control signal, to allow current to pass through the first LED such that the first LED lights to indicate the voltage is greater than the upper limit of the specified voltage range;
a second comparison voltage generating circuit for providing a second comparison voltage which equals a lower limit of the specified voltage range as determined by the design of the component;
a second comparator comprising a non-inverting input for receiving the second comparison voltage, an inverting input for receiving the voltage output by the power supply, and an output for outputting a second control signal when the voltage is less than the second comparison voltage;
a second electronic switch comprising a first terminal connected to the output of the second comparator, a second terminal connected to the reference voltage, and a third terminal connected to ground; and
a second LED comprising an anode connected to the reference voltage, and a cathode connected to the second terminal of the second electronic switch, wherein the second electronic switch turns on, when receiving the second control signal, to allow current to pass through the second LED such that the second LED lights to indicate the voltage provided by the power supply is below the lower limit of the specified voltage range;
a third LED comprising an anode connected to the anodes of the first and second LEDs directly, and a cathode;

a third electronic switch comprising a first terminal connected to the cathode of the third LED, a second terminal connected to the reference voltage, and a third terminal grounded;

a fourth electronic switch comprising a first terminal connected to the second terminal of the third electronic switch, a second terminal connected to the reference voltage via a buzzer;

wherein in response to at least one of the first and second LEDs being turned on, the anodes of the first and second LEDs have the same voltage equal to a threshold voltage of the third LED to turn off the third LED, the third electronic switch is turned off, and the fourth electronic switch is turned on to allow current to pass through the buzzer such that the buzzer alarms; and wherein in response to the first and second LEDs being turned off, a voltage of the anode of the third LED is greater than the threshold voltage, such that the third LED is turned on to indicate the voltage provided by the power supply is within the specified voltage range, the third electronic switch is turned on, the fourth electronic switch is turned off, and the buzzer does not alarm.

2. The voltage monitoring device as claimed in claim 1, wherein the buzzer comprises a first terminal connected to the reference voltage via a resistor, and a second terminal connected to a second terminal of the fourth electronic switch.

3. The voltage monitoring device as claimed in claim 1, wherein the first comparison voltage generating circuit comprises a first resistor and a first variable resistor connected between a constant voltage and ground, a node between the first resistor and the first variable resistor outputs the first comparison voltage.

4. The voltage monitoring device as claimed in claim 1, wherein the second comparison voltage generating circuit comprises a second resistor and a second variable resistor connected between the constant voltage and ground, a node between the second resistor and the second variable resistor outputs the second comparison voltage.

5. The voltage monitoring device as claimed in claim 1, wherein the second terminal of each of the first, second, third, and fourth electronic switches is connected to the reference voltage via a resistor, and the anode of the first LED is connected to the reference voltage via a resistor.

6. The voltage monitoring device as claimed in claim 1, wherein the first, second, third, and fourth electronic switches are bipolar junction transistors or MOSFETs.

* * * * *